(12) United States Patent
Dias

(10) Patent No.: US 7,687,816 B2
(45) Date of Patent: Mar. 30, 2010

(54) LIGHT EMITTING DIODE

(75) Inventor: Eric W B Dias, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 11/688,512

(22) Filed: Mar. 20, 2007

(65) Prior Publication Data

US 2008/0230795 A1    Sep. 25, 2008

(51) Int. Cl.
*H01L 33/00* (2010.01)
(52) U.S. Cl. .............. 257/98; 257/E33.061; 438/29
(58) Field of Classification Search ............ 257/98, 257/E33.061; 438/29
See application file for complete search history.

(56) References Cited

U.S. PATENT DOCUMENTS

| | | | |
|---|---|---|---|
| 5,813,753 | A | 9/1998 | Vriens et al. |
| 7,071,616 | B2 | 7/2006 | Shimizu et al. |
| 7,083,302 | B2 | 8/2006 | Chen et al. |
| 7,088,040 | B1 | 8/2006 | Ducharme et al. |
| 2003/0006382 | A1 | 1/2003 | Spath et al. |
| 2004/0217692 | A1* | 11/2004 | Cho et al. ............... 313/503 |
| 2004/0222735 | A1* | 11/2004 | Ragle ..................... 313/501 |
| 2005/0135079 | A1* | 6/2005 | Yin Chua et al. ......... 362/12 |
| 2006/0027781 | A1 | 2/2006 | Dong et al. |
| 2006/0169993 | A1* | 8/2006 | Fan et al. ................ 257/88 |
| 2006/0221637 | A1* | 10/2006 | Chikugawa et al. ...... 362/612 |
| 2006/0261742 | A1* | 11/2006 | Ng et al. ................ 315/86 |

OTHER PUBLICATIONS

Yihong Chen; Faris, G.; "Absolute measurement of phosphorescent cross sections for upconverting phosphors" Lasers and Electro-Optics, 1998. CLEO 98. Technical Digest. Summaries of papers presented at the Conference on May 3-8, 1998 p. 229.
Faris, G.W.; Dyer, M.J. "Demonstration of molecular upconvertors" Quantum Electronics and Laser Science Conference, 1999. Technical Digest. Summaries of Papers Presented at the May 23-28, 1999 pp. 262-263.
Ana Maria Pires • Stephan Heer • Hans Ulrich Gudel • Osvaldo Antonio Serra "Er, Yb Doped Yttrium Based Nanosized Phosphors: Particle Size, "Host Lattice" and Doping Ion Concentration Effects on Upconversion Efficiency" Journal Fluoresc (2006) 16:461-468.

* cited by examiner

*Primary Examiner*—Trung Dang
(74) *Attorney, Agent, or Firm*—Grant A. Johnson

(57) ABSTRACT

A light emitting diode and a method of producing white light from the light emitting diode with an active region producing an emission falling in a primary wavelength range. A first part of the active region covered with a first conversion element for converting the emission falling in the primary wavelength range to an emission falling in a second wavelength range. A remaining second part of the active region covered with a second conversion element for converting the emission falling in the primary wavelength rage to an emission falling in a third wavelength range. The light emitting diode is configured to control the intensity of the emission falling in the primary wavelength range to control the color point of the white light generated by mixing the emissions falling the second wavelength range and the third wavelength range. The LED 100 can be advantageously used to be assembled into a backlight unit for lighting up display devices, such as liquid crystal display device, provides illumination to the display panel where an adjustable color temperature and high contrast can be provided to improve readability and viewing on the display depending on the application in use.

25 Claims, 4 Drawing Sheets

LIGHT EMITTING DIODE

FIELD OF THE INVENTION

This invention relates to a light emitting diode and in particular to a light emitting diode to produce white light of a desired color temperature.

BACKGROUND OF THE INVENTION

A light-emitting diode (LED) is a semiconductor device that emits incoherent narrow-spectrum light when electrically biased in the forward direction. This effect is a form of electroluminescence. The color of the emitted light depends on the composition and condition of the semi-conducting material used, and can be infrared, visible or near-ultraviolet. Like a normal diode, it consists of a chip of semi-conducting material impregnated, or doped, with impurities to create a p-n junction, as current flows easily from the p-side, or anode, to the n-side, or cathode, but not in the reverse direction. Charge-carriers, which are electrons and electron holes, flow into the junction from electrodes with different voltages. When an electron meets a hole, it falls into a lower energy level, and releases energy in the form of a photon.

LEDs were first developed with infrared and red devices made with gallium arsenide. However, advances in materials science have made possible the production of devices with ever-shorter wavelengths, producing light in a variety of colors. LEDs are conventionally built on an n-type substrate, such as sapphire, with electrode attached to the p-type layer deposited on its surface. While the less common P-type substrates may occur as well. Substrates that are transparent to the emitted wavelength, and backed by a reflective layer, increase the LED efficiency. The refractive index of the package material should match the index of the semiconductor. A disadvantage with the LED is that the light produced gets partially reflected back into the semiconductor, where it gets absorbed and turns into additional heat.

An embodiment of a white LED is disclosed in United States Published Patent Application Number 20070024191. The white light emitting diode (LED) includes a reflective mirror arranged on the light emitting path of a blue or an ultra violet LED die at an appropriate angle. Phosphors are coated on the reflective mirror, the emitting plane of the LED, or both so that the phosphors are excited by the blue or UV lights emitted by the LED die to produce white lights. The white LED has a long lifetime and a uniform light color by separating the phosphors from the LED die, and by allowing the lights emitted from the LED die to undergo several excitations with the phosphors.

Typically, in applications where light from a single LED is insufficient, several LEDs need to be put together to provide illumination. This is for example, the case in a backlight unit, such as display which relies on a number of white LEDs to provide illumination to the display. It should be obvious to a person skilled in the art that LEDs are advantageously used in all kinds of devices for performing different jobs. Among other things, they form the numbers on digital clocks, transmit information from remote controls, light up watches and indicate when your appliances are turned in use. Collected together, they can form images on displays, such as laptop computers, personal digital assistants, mobile phones, television screen or even illuminate a traffic light. It is therefore preferable that such devices and/or displays exhibit a uniform color temperature. However, in certain types of LEDs coated with a phosphor to generate white light, the so called white LEDs, exhibit variations in color temperature due to differences in raw material sources, crystal growth, handling, storage conditions for the raw materials, and the other variables that go into the manufacturing process. Therefore, the LEDs that are manufactured required to be binned before being assembled into the backlight unit of a display. The binning methods typically use color coordinates or correlated color temperature (CCT) for sorting the LEDs, but LEDs with the same CCT can still have a different color tint. Manufacturers have used new binning strategies that tend to reduce the variability of LEDs within each bin. Such binning processes significantly increase the cost of manufacturing the LEDs.

Therefore a need exists to provide an improved LED capable of providing white light ameliorating one or more of the above mentioned disadvantages. Without a way to provide the improved LED capable of generating white light of a desired color temperature and the method of generating white light from of a desired color point using the improved LED, the promise of this technology may never be fully achieved.

SUMMARY OF THE INVENTION

Accordingly, the present invention provides a light emitting diode with an active region for producing an emission falling in a primary wavelength range. A first part of the active region covered with a first conversion element for converting the emission falling in the primary wavelength range to an emission falling in a second wavelength range. A remaining second part of the active region covered with a second conversion element for converting the emission falling in the primary wavelength rage to an emission falling in a third wavelength range. The light emitting diode is configured to control the intensity of the emission falling in the primary wavelength range to control the color point of the white light generated by mixing the emissions falling the second wavelength range and the third wavelength range. The LED 100 can be advantageously used to be assembled into a backlight unit for lighting up display devices, such as liquid crystal display device, provides illumination to the display panel where an adjustable color temperature and high contrast can be provided to improve readability and viewing on the display depending on the application in use. The LED can be advantageously used to be assembled into a lamp wherein white light with a desired color point is required.

According to a further aspect of the invention is a method of producing white light from a light emitting diode by converting an emission falling in a primary wavelength range produced by an active region substantially into an emission falling in a second wavelength range by a first conversion element. Converting the emission falling in the primary wavelength range produced by the active region substantially into an emission falling in a third wavelength range by a second conversion element. Subsequently, mixing the emission falling in the second wavelength and the emission falling in the third wavelength range to produce white light. Accordingly, the bias provided to the active region of the light emitting diode may be adjusted suitably by means of a control unit thereby controlling the intensity of the emission falling in the primary wavelength range to generate a white light of a desired color point.

BRIEF DESCRIPTION OF THE DRAWINGS

These and further aspects of the present invention will become apparent from and will be elucidated with respect to the embodiments described hereinafter with reference to the accompanying drawings. The drawings illustrate the embodi- In the Drawings

DETAILED DESCRIPTION

Figure 1A:
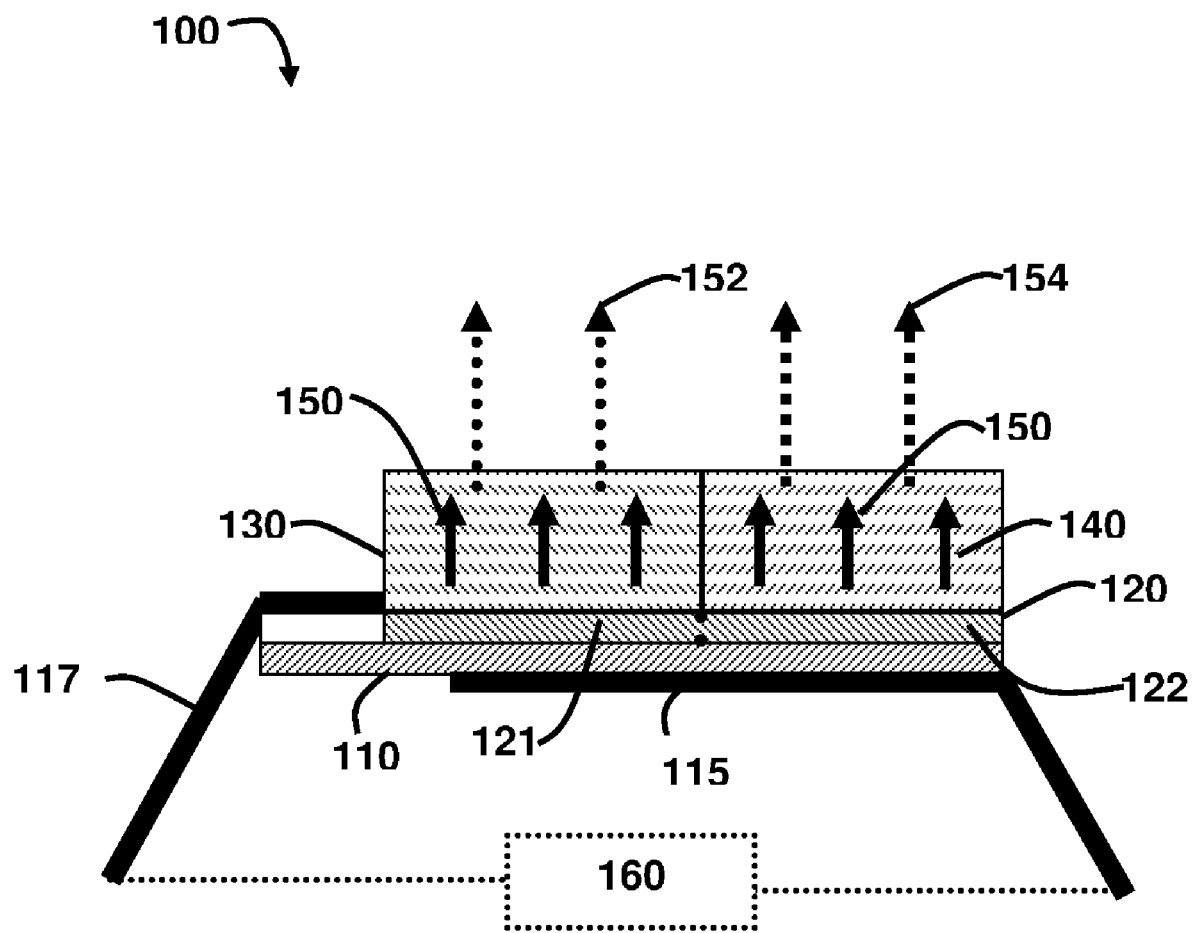
FIG. 1A illustrates an exemplary embodiment of a light emitting diode 100 in accordance with the present invention.

FIG. 1A illustrates an exemplary embodiment of the inside of a light emitting diode 100 in accordance with the present disclosure. The light emitting diode 100 (hereinafter also referred to as LED) consists of a substrate 110, for example Sapphire or any other suitable materials used to form substrates, to which has a common cathode 115 is coupled, the cathode 115 being further coupled to a control unit 160. An active region 120, for example a semiconductor alloy such as GaAs, AlGaAs, GaP, GaAsP, etc, which provide an emission falling in the primary wavelength range 150, typically red wavelength range, is formed on the substrate 110. Such LEDs providing emission in the red wavelength range are easy to manufacture at a relatively low cost. An anode 117 is coupled to the active region 120 and the anode 117 is coupled to a control unit 160, typically an electronic/electrical circuit providing current to drive the LED. The control unit 160 and the connectors (not shown in the Figure) that connect the cathode 115 and the anode 117 are optional elements. The connections of the cathode and the anode with the control unit made by means of the connectors are well known to a person skilled in the art. The LED 110 is typically manufactured and sold without the control unit 160 and the connectors.

The active region 120 is a doped semiconductor forming a p-n junction and to the common control unit 160 via the anode 117 that provides the required current to drive the LED. The current flows from the anode 117 (the p-side) to the cathode 115 (n-side). Charge carriers, i.e., electrons and electron holes, flow into a junction from electrodes 115, 117 with different voltages. When an electron meets a hole, the electron typically falls into a lower energy level thereby releasing energy in the form of a photon. The active regions 120 may be formed by means of epitaxy, etching or similar techniques either on a single substrate 110 or as well on independent respective substrates. The potential difference causes the active region preferably to provide emission in the red and/or near infra red wavelength range of the visible spectrum when the forward bias is applied.

The active region 120 when provided with a bias provides an emission falling in a primary wavelength range 150 (peaking in the red or near infra red wavelength range of the visible spectrum having a peak wavelength at 600 nm or more, which will be hereinafter referred to as red light). A first part 121 of the active region 120 is covered with a first conversion element 130, the first conversion element being an up-converting phosphor or up-converting quantum dots, which is capable of completely converting the emission falling within the first wavelength range 150 into an emission falling within a second wavelength range 152. The converted emission falling within the second wavelength range, which falls within the blue wavelength range of the visible spectrum (hereinafter referred to as blue light). The remaining second part 122 of the active region 120 is covered with a second conversion element 140, typically an up-converting phosphor or up-converting quantum dots, which is capable of completely converting the emission falling within the first wavelength range 150 into an emission falling within a third wavelength range 154, which falls in the yellow wavelength range of the visible spectrum (hereinafter referred to as yellow light). Therefore the first conversion element 130 completely converts the red light 150 into blue light 152 and the second conversion element 140 completely converts the red light 150 into yellow light 154. It should be apparent to a person skilled in the art, that more than one combination of phosphors can be used to provide different colors of light. For example in one embodiment, a part of the active region 120 can be left exposed and a part of the active region can be covered with a phosphor that converts the red light to blue light and the remaining part of the active region can be covered with a phosphor that converts red light to green light (yellowish green light), and mixing the red light, blue light and green light to produce white light of a desired color point by controlling the intensity of the emission of the red light.

The phosphors 130, 140 and/or quantum dots are chosen such that they up-convert the emission from the active region, red light 150, completely to a respective blue wavelength range 152 (blue light) and a respective yellow wavelength range 154 (yellow light). For the complete conversion of the red light, into blue light and yellow light, the thickness of the first conversion element 130 and the second conversion element 140 is chosen such that the entire emission from the active region, which is red light 150, is converted to an blue light 152 and yellow light 154. For example in one embodiment Er, Yb Doped Yttrium Based nanosized phosphors are advantageously used as up-converting phosphors for up-converting the red light to blue light and/or yellow light. To fully convert the red light 150 emitted from the active region 120 using the conversion element 130, 140 the thickness of the conversion element is a critical factor, especially when the conversion element is a phosphor. When quantum dots are used instead of a phosphor, a thin coating of the quantum dots should be capable of fully converting light from one wavelength to another wavelength. When either the phosphor or the quantum dots are used, the thickens should be substantially sufficient to completely covert the red light into blue light and yellow light. However, it should be apparent to a person skilled in the art that the output efficiency of quantum dots is lesser compared to that of phosphors, and hence phosphors are preferred. The thickness of the phosphor should be optimally chosen such that all red light is converted to blue light with the first conversion element 130, and all red light is converted to yellow light with the second conversion element 140. The blue light 152 and the yellow light 154 can then be suitably mixed forming white light, wherein the color point of the white light can be adjusted by controlling the current supplied to the active region, which in turn controls the intensity of the red light 150.

In a further embodiment, the electrodes 115, 117 of the light emitting diode 100 are coupled to a control unit 160, which is configured to control the intensity of the emission falling in the primary wavelength range, by means of a variable resistor, which can regulate the current supplied to the active region 120, thereby regulating the intensity of the red light emitted. By controlling the current supplied to the active region, the color point of the white light generated by mixing the emissions falling the second wavelength range 152 and the third wavelength range 154 can be suitably controlled depending on the device and the application of use.

Preferably, the connectors such as the anode, cathode and all wire bonds that are used in the LED are made from the same conducting metal such that they have the same electrical and thermal properties, leading to improved conductivity as compared to situations wherein different materials are used. In a further embodiment, preferably, the voltages supplied to the active regions can be independently controlled to obtain mixed white light of a desired color temperature. By regulating the current supplied to the active regions, the intensity or power of the emission falling within the primary wavelength range can be easily regulated and hence the white point color temperature can be suitable adjusted. As a result, a light source with a variable color temperature may be realized using this simple structure. This is because the luminous intensity of the yellow emitting phosphor is essentially correlated with that of the emission blue emitting phosphor. Thus, by appropriately controlling the luminous intensities of the active region the LED may be made to produce white light of any arbitrary color temperature.

Figure 1B:
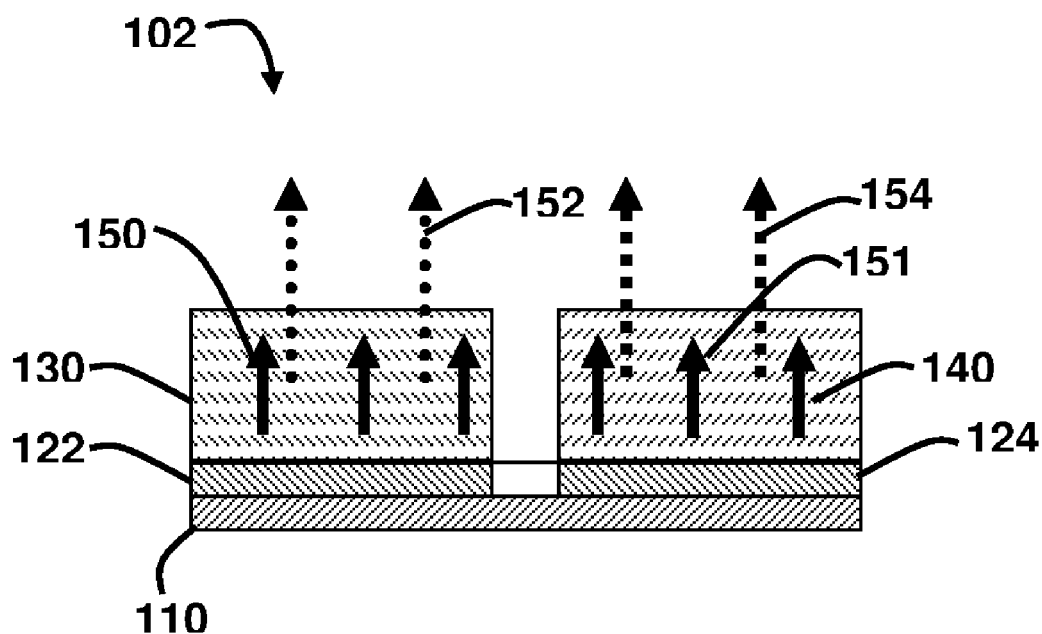
FIG. 1B illustrates an exemplary embodiment of an LED formed on a single substrate.

FIG. 1B illustrates an exemplary embodiment of the LED 101 formed on a single substrate 110. A first active region 122 is formed on a first part of the substrate and a second active region 124 is formed on a second part of the substrate 110. Both the active regions 122, 124 are coupled to an external control unit (not shown in the figure) and the current supplied to each of the active regions may be suitably adjusted independently. The first active region 122 is covered with a first conversion element 130 for fully converting the emission in the primary wavelength range 150 (red light) into an emission falling within a second wavelength range 152 (blue light). The second active region 124 is covered with a second conversion element for fully converting the emission in the primary wavelength range 150 (red light) into an emission falling within a third wavelength range 154 (yellow light). The blue light 152 and the yellow light 154 are mixed to provide white light. The color point of the white light can be suitably adjusted by independently controlling the currents supplied to each of the first active regions 122 and the second active regions 124 independently. All other operations details of the active regions and the conversion elements (phosphor) remain the same as described previously with respect to FIG. 1A.

Figure 1C:
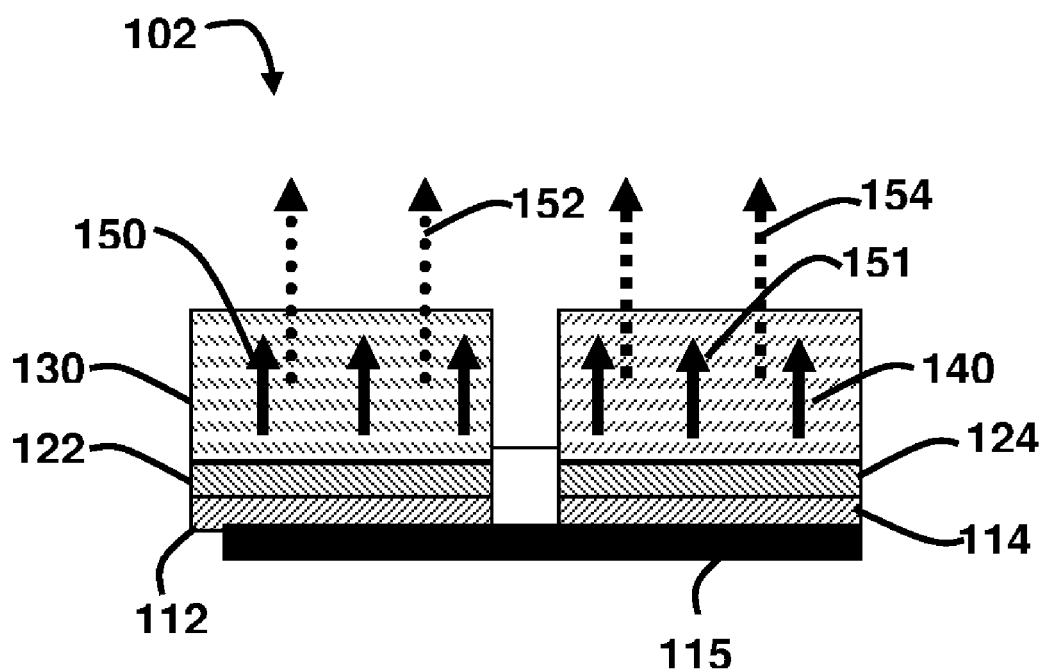
FIG. 1C illustrates an exemplary embodiment of an LED formed on a separate substrate.

FIG. 1C illustrates an exemplary embodiment of the LED 102 formed on a separate substrate. A first active region 122 is formed on a first substrate 112 and a second active region 124 is formed on a second substrate 114. The first substrate 112 and the second substrate 114 are mounted on a common electrode 115. Both the active regions 122, 124 are coupled to an external control unit (not shown in the figure) and the current supplied to each of the active regions may be suitably adjusted independently. The first active region 122 is covered with a first conversion element 130 for fully converting the emission in the primary wavelength range 150 (red light) into an emission falling within a second wavelength range 152 (blue light). The second active region 124 is covered with a second conversion element for fully converting the emission in the primary wavelength range 150 (red light) into an emission falling within a third wavelength range 154 (yellow light). The blue light 152 and the yellow light 154 are mixed to provide white light. The color point of the white light can be suitably adjusted by independently controlling the currents supplied to each of the first active regions 122 and the second active regions 124 independently. All other operations details of the active regions and the conversion elements (phosphor) remain the same as described previously with respect to FIG. 1A.

Figure 2A:
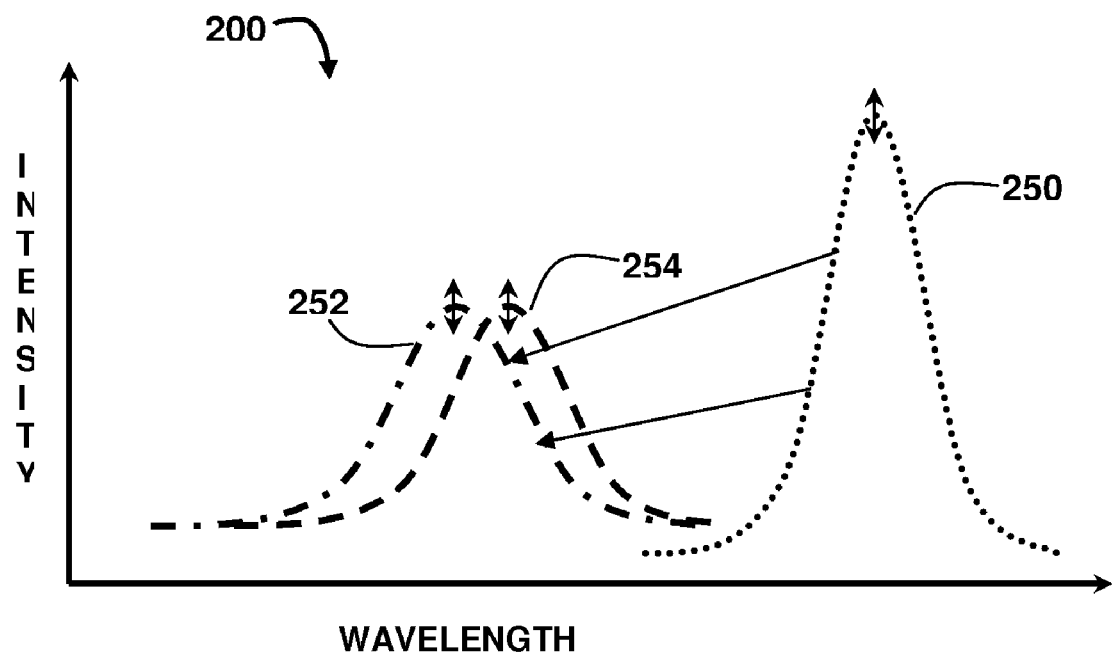
FIG. 2A illustrates an exemplary embodiment of a spectrum for a white LED.

FIG. 2A illustrates an exemplary embodiment of a spectrum 200 for a white LED 100, as disclosed herein. The x-axis represents wavelength of the emission spectra produced by the active region of the LED and the converted spectrum of the LED, and the y-axis represents intensity of the emission. The white LED represents provides an emission falling in the primary wavelength range 250, which has a peak at about 600 nm or more and falls in the red/infra red part of the visible spectrum. The double arrow on the peak of the emission 250 indicates that the intensity of the emission can be controlled by the control unit as described previously in FIG. 1. The red light 250 emitted from the active region is completely converted into blue light 252 by a first conversion element and into yellow light 254 by a second conversion element, respectively. The blue light 252 and the yellow light 254 can be mixed to provide white light. The mixing of blue light and yellow light to generate white light is well know to a person skilled in the art. The color point of the white light can be suitably adjusted by controlling the intensity of the emission of the red light.

Figure 2B:
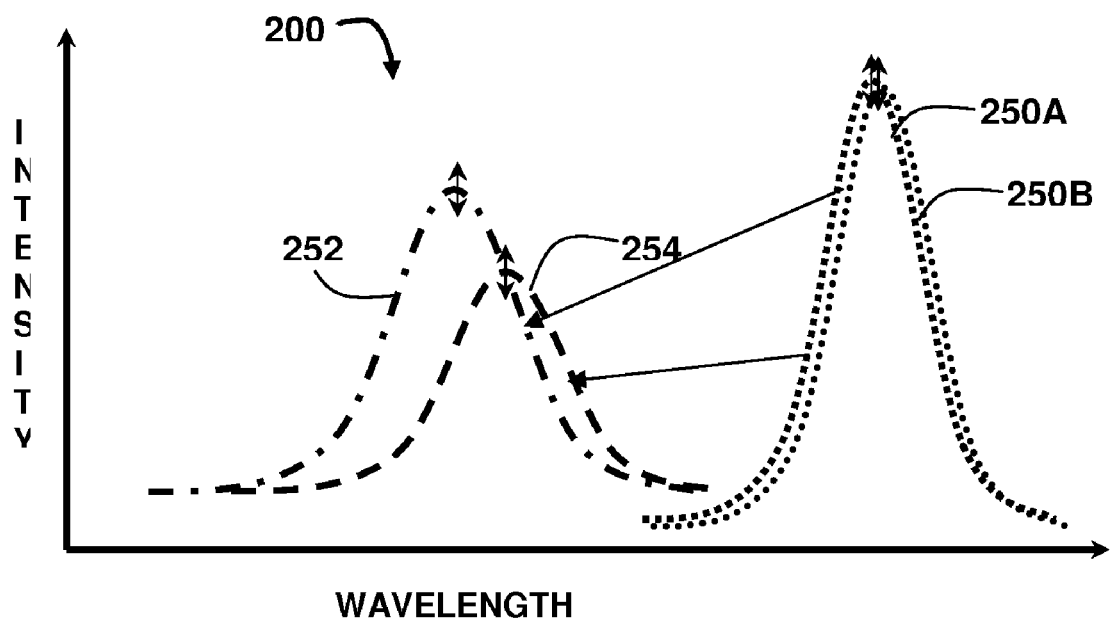
FIG. 2B illustrates another exemplary embodiment of a spectrum for a white LED.

FIG. 2B illustrates an exemplary embodiment of a spectrum 201 for a white LED 102. The x-axis represents wavelength of the emissions and the y-axis represents the intensity of the emission spectrum. The first active region provides an emission in the red wavelength range 250A and the second active regions provides an emission in the red wavelength range 250B. For the purpose of illustration, two peaks are shown alongside each other. The first conversion element fully converts the red light 250A to blue light 252 and the second conversion element fully converts the red light 250b to yellow light 254. The blue light 252 and the yellow light 254 can be suitably mixed to provide white light. The color temperature of the white light can be chosen by suitably varying the intensity of the emission of the red light 205A and/or 250B. For the purpose of illustration, it is shown that the emission of blue light 252 is a little more intense than the emission of yellow light 254. An advantage is that the higher the intensity of the blue light 252, the higher is the correlated color temperature and hence the color point.

As discussed previously, the current to the first active region 122 and second active region 124 can be independently controlled thereby independently regulating the intensities of the emission from these active regions. The double-headed arrows on the peak of the spectrum of the blue light, and peak of the spectrum of the yellow light indicate that controlling the current supplied to the first active region 122 and second active region 124 can regulate the intensities of the blue and yellow light. As a result of regulating the current supplied to each of the first active region and second active region (or the single active region in general) by the control unit, the intensities are suitably adjusted, thereby adjusting the correlated color temperature of the white light produced, for example to obtain tropical daylight, neutral white, warm white or light in the spectrum produced by an incandescent lamp.

Figure 3:
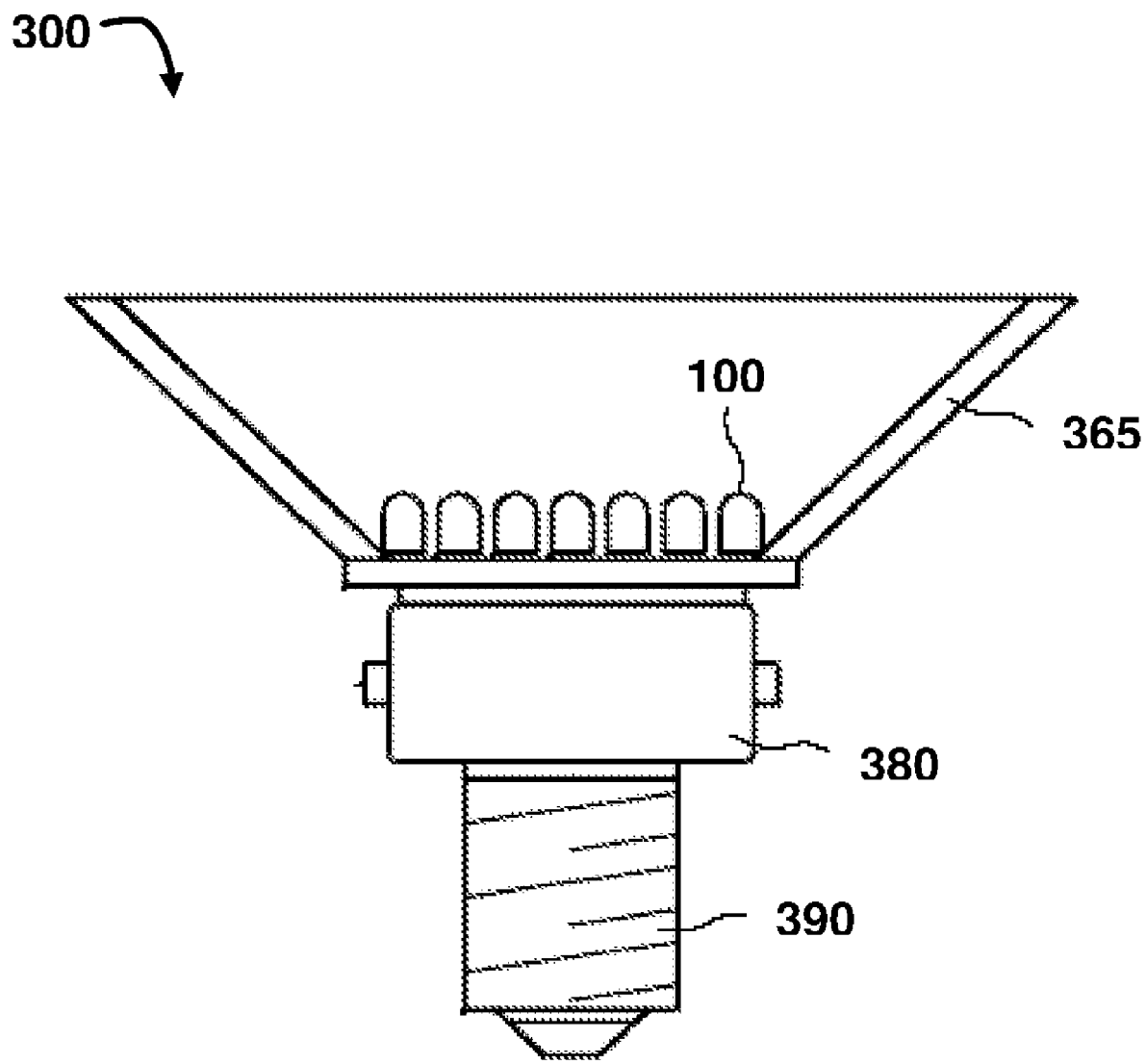
FIG. 3 illustrates an exemplary embodiment of a lamp.

FIG. 3 illustrates an exemplary embodiment of a lamp 300 constructed by assembling at least one LED as shown in FIG. 1. Typically, several LEDs 100 are combined to form a lamp 300. The lamp comprises a reflector 365, which is a highly polished surface to reflect light generated from the lamp, a power supply unit 380 for supplying power to the LEDs 100, and a base 390. In addition the lamp 300 may have a color control dial (not shown in the figure) and a brightness control dial (not shown in the figure) which can be used to control the color and brightness of the lamp 300.

In a further embodiment, at least one or more LEDs 100 forming an array can be advantageously used to be assembled into a backlight unit for lighting up display devices, such as liquid crystal display device, provides illumination to the display panel where an adjustable color temperature and high contrast can be advantageously provided to improve readability and viewing on the display depending on the application in use.

The accompanying figures and this description depicted and described embodiments of the present invention, and features and components thereof. Those skilled in the art will appreciate that any nomenclature and/or illustrations used in this description was merely for convenience, and thus the invention should not be limited to use solely in any specific application identified and/or implied by such nomenclature. Therefore, it is desired that the embodiments described herein be considered in all respects as illustrative, not restrictive, and that reference be made to the appended claims for determining the scope of the invention.

Although the invention has been described with reference to the embodiments described above, it will be evident that other embodiments may be alternatively used to achieve the same object. The scope of the invention is not limited to the embodiments described above, but can also be applied to software programs and computer program products in general. It should be noted that the above-mentioned embodiments illustrate rather than limit the invention and that those skilled in the art will be able to design alternative embodiments without departing from the scope of the appended claims. In the claims, any reference signs should not limit the scope of the claim. The invention can be implemented by means of hardware comprising several distinct elements.

What is claimed is:

1. A light emitting diode comprising:
   an active region for producing an emission falling in a primary wavelength range comprising red light;
   a first part of the active region covered with a first conversion element for converting the emission produced in the primary wavelength range to a second wavelength range; and
   a remaining second part of the active region covered with a second conversion element for converting the emission produced in the primary wavelength range to a third wavelength range.

2. The light emitting diode of claim 1, wherein the first conversion element and the second conversion element comprises a respective phosphor.

3. The light emitting diode of claim 1, wherein the first conversion element and the second conversion element comprises respective quantum dots.

4. The light emitting diode of claim 1, wherein the active region comprises a first active region and a second active region formed on a single common substrate, the first conversion element covering the first active region and the second conversion element covering the second active region.

5. The light emitting diode of claim 1, wherein the second wavelength range comprises blue light.

6. The light emitting diode of claim 1, wherein the third wavelength range comprises yellow light.

7. The light emitting diode of claim 1, configured to provide mixing of the second wavelength range and the third wavelength range for generating white light.

8. The light emitting diode of claim 1, wherein the first active region is formed on a first substrate and the second active region is formed on a second substrate, and the first active region is covered with the first conversion element and the second active region is covered with the second conversion element.

9. The light emitting diode of claim 1, further comprising:
   a control unit, wherein the control unit controls the intensity of the emission in the primary wavelength range.

10. The light emitting diode of claim 9, wherein the control unit comprises: a variable resistor coupled to the active region and configured to control the intensity of the primary wavelength light thereby dynamically controlling the white point.

11. A method for producing white light, the method comprising:
   converting an emission in a primary wavelength range produced by an active region substantially into an emission in a second wavelength range by a first conversion element, wherein the primary wavelength range comprises red light; and
   converting the emission in the primary wavelength range produced by the active region substantially into an emission in a third wavelength range by a second conversion element.

12. The method of claim 11, further comprises mixing the emission in the second wavelength and the emission in the third wavelength range to produce white light.

13. The method of claim 11, further comprising: adjusting the bias to the active region to control the intensity of the emission in the primary wavelength range to generate a white light of a desired color point.

14. The method of claim 11, wherein the emission in the second wavelength range comprises blue light.

15. The method of claim 11, wherein the emission in the third wavelength range comprises yellow light.

16. A lamp unit comprising: at least one light emitting diode, the at least one light emitting diode comprising:
   an active region for producing an emission falling in a primary wavelength range comprising red light;
   a first part of the active region covered with a first conversion element for converting the emission produced in the primary wavelength range to a second wavelength range comprising blue light;
   a remaining second part of the active region covered with a second conversion element for converting the emission produced in the primary wavelength range to a third wavelength range comprising yellow light; and
   a power supply to supply power to the lamp.

17. The lamp of claim 16, wherein the first conversion element and the second conversion element is selected from the group consisting of: a respective phosphor and quantum dots.

18. The lamp of claim 16, configured to provide mixing of the emission in the second wavelength range and the emission in the third wavelength range for generating white light.

19. The lamp of claim 16, further comprising: a reflector for reflecting the light produced from the lamp.

20. A backlight unit for a display comprising:
   at least one light emitting diode comprising an active region for producing an emission falling in a primary wavelength range comprising red light;
   a first part of the active region covered with a first conversion element for converting the emission produced in the primary wavelength range to a second wavelength range comprising blue light;
   a remaining second part of the active region covered with a second conversion element for converting the emission produced in the primary wavelength range to a third wavelength range comprising yellow light; and a power supply to supply power to the light emitting diodes.

21. The backlight unit of claim 20, wherein the first conversion element and the second conversion element comprises a respective phosphor or quantum dots.

22. The backlight unit of claim 20, configured to provide mixing of the emission in the second wavelength range and the emission in the third wavelength range for generating white light.

23. A light emitting diode comprising:

an active region for producing an emission falling in a primary wavelength range comprising red light;

a first part of the active region covered with a first conversion element for up-converting the emission produced in the primary wavelength range to a second wavelength range; and a remaining second part of the active region covered with a second conversion element for up-converting the emission produced in the primary wavelength range to a third wavelength range.

24. The light emitting diode of claim 23, wherein the first conversion element and the second conversion element comprise respective phosphors.

25. The light emitting diode of claim 23, wherein the first conversion element and the second conversion element comprise respective quantum dots.

* * * * *